United States Patent [19]
Nelson

[11] Patent Number: 5,220,272
[45] Date of Patent: Jun. 15, 1993

[54] SWITCHING REGULATOR WITH ASYMMETRICAL FEEDBACK AMPLIFIER AND METHOD

[75] Inventor: Carl T. Nelson, Santa Clara County, Calif.

[73] Assignee: Linear Technology Corporation, Milpitas, Calif.

[21] Appl. No.: 579,773

[22] Filed: Sep. 10, 1990

[51] Int. Cl.⁵ .............................................. G05F 1/56
[52] U.S. Cl. .................... 323/282; 323/288; 323/351; 330/252
[58] Field of Search .................... 363/17, 49; 323/282, 323/284, 288, 273, 274, 280, 351, 352, 353; 330/252, 257

[56] References Cited
U.S. PATENT DOCUMENTS

| | | |
|---|---|---|
| 4,218,647 | 8/1980 | Haas . |
| 4,583,156 | 4/1986 | Forge .................................... 363/17 |
| 4,713,740 | 12/1987 | Drabing .............................. 363/17 |

Primary Examiner—Steven L. Stephan
Assistant Examiner—Emanuel Todd Voeltz
Attorney, Agent, or Firm—Flehr, Hohbach, Test, Albritton & Herbert

[57] ABSTRACT

A switching regulator network is disclosed which receives an input voltage and provides a regulated constant output supply voltage. The regulator includes a pulse width modulated switching circuit which regulates the output voltage responsive to a feedback error signal. A transconductance error amplifier produces an error feedback signal which is proportional to the difference between the reference input voltage and the output voltage. The overshoot of the output supply voltage is minimized by including a means in the transconductance error amplifier to provide a higher negative slew rate current than the positive slew rate current. This is done without employing extra pins or parts in the integrated circuit.

3 Claims, 2 Drawing Sheets

SWITCHING REGULATOR WITH ASYMMETRICAL FEEDBACK AMPLIFIER AND METHOD

BRIEF DESCRIPTION OF THE INVENTION

This invention relates generally to switching regulators, and more particularly, to switching regulators employing an asymmetrically slewed feedback amplifier circuit and a method of operation.

BACKGROUND OF THE INVENTION

A wide range of three terminal linear regulator integrated circuits are available to provide clean, constant supply voltages regulated for line and load changes. Such regulators are notoriously inefficient, and with linear regulator circuits it is not possible to get a higher output voltage than the input voltage.

Integrated circuit switching regulators have recently become available. Such regulators employ pulse width modulated switching circuits in which the regulation is achieved by an active feedback network which samples the output voltage and generates a voltage which controls the pulse width of the switcher. Switching regulators provide the ability to achieve output voltages which are higher than the input voltage and are highly efficient.

A problem encountered in switching regulators with active feedback circuits is that they are subject to overshoot of the output voltage when input power is applied or when a short is removed. This is due to the slow response of the typical feedback network. Slow responses are necessary to insure that the regulator does not oscillate.

There have been a number of solutions proposed to prevent or minimize output overshoot. These solutions are generally not satisfactory because they require extra components, do not work under all conditions, or require extra pins to be added to the integrated circuit.

OBJECTS AND SUMMARY OF THE INVENTION

It is an object of this invention to provide an improved switching regulator and a method of operation.

It is another object of this invention to provide an improved feedback error amplifier for a switching regulator.

It is a further object of this invention to provide a feedback amplifier for switching regulators which has asymmetrical slewing rates.

It is a further object of this invention to provide a switching regulator in which overshoot is minimized and which works for all conditions that cause overshoot, does not require extra pins in an integrated circuit or extra parts.

The foregoing and other objects of the invention are achieved in a switching regulator which receives an input voltage and provides a regulated output voltage. The regulator includes a pulse width modulated switch circuit which regulates the output voltage responsive to a feedback error signal. A transconductance error amplifier samples the output voltage, compares it to a reference voltage and provides the error feedback signal. The transconductance amplifier includes means providing a higher negative slew rate than the positive slew rate to minimize overshoot.

BRIEF DESCRIPTION OF THE DRAWINGS

The above and other objects of the invention will be more clearly understood from the following description when taken in connection with the drawings, of which.

DETAILED DESCRIPTION OF A PREFERRED EMBODIMENT

Figure 1:
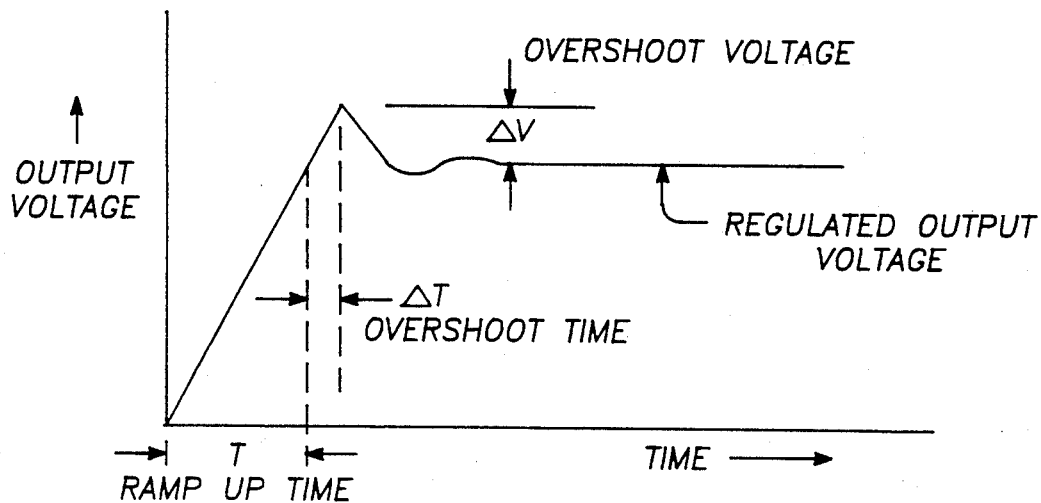
FIG. 1 shows the output voltage as a function of time when input power is applied or when an output short is removed.

FIG. 1 shows the output voltage as a function of time following power-up of a conventional switching regulator. It is seen that the output voltage ramps up at a substantially constant rate. However, the output voltage overshoots the regulated output voltage. Feedback voltage controls the switching regulator to cause overvoltage to ramp back down.

Figure 2:
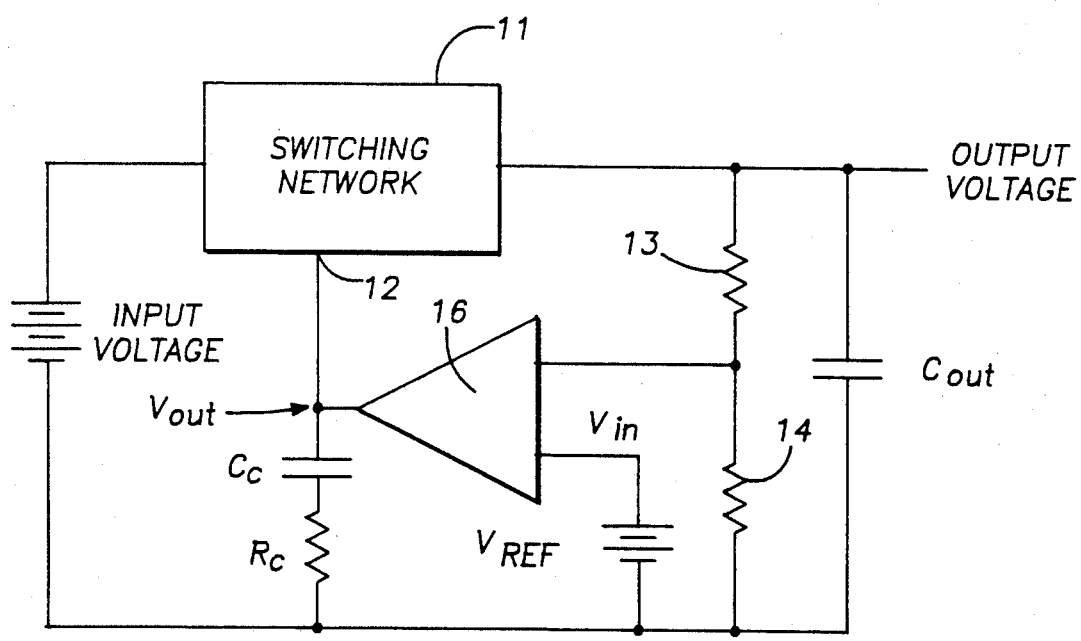
FIG. 2 is a schematic block diagram of a switching regulator.

FIG. 2 shows a switching regulator which includes a switching network 11 which switches the input d.c. voltage to form a rectangular wave which can be suitably filtered to provide an output voltage. The output voltage amplitude is regulated by modulating or controlling the pulse width of the rectangular wave responsive to an input feedback error signal at terminal 12. Feedback signal is generated by sampling the output voltage across resistors 13 and 14 and applying the sample output as one input to an error amplifier 16. The other input is a reference voltage. The error amplifier is preferably a transconductance type amplifier whose small signal output voltage $V_{out}$ is given by $(G_m)(Z_{load})(V_{in})$, where $(Z_{load})$ is the impedance of the external components $C_c$ and $R_c$. When overdriven, the amplifier operates in a slew rate limited condition (constant output current) where the voltage at $C_c$ increases linearly with time. The error amplifier 16 develops a control voltage, $V_{out}$, at the terminal 12.

As described above, the switching regulator generally operates with an overshoot during startup or following the removal of an output short. To generate a mathematical model for overshoot, the following assumptions are made. Output slew rate is set by the regulator output current limit and the output capacitance; $dV_{out}/dt = I_{lim}/C_{out}$. Ramp-up time (T) is therefore $(C_{out})(V_{out})/(I_{lim})$. During this time, the error amplifier output will be in positive slew limit (SR+) and will attain a voltage at the capacitor $C_c$ equal to $(SR+)(T)$. During the overshoot time ($\Delta T$), the error amplifier output must slew negative until it reduces switching output current to zero. $\Delta T$ is therefore equal to $(SR+)(T)/(SR-)$. Overshoot voltage can be found from overshoot time and regulator output slew rate:

$$\Delta V = \Delta T \cdot dV_{out}/dt = \frac{(SR+)(T)}{SR-} \cdot \frac{dV_{out}}{dt}$$

$$= (SR+/SR-)\,[(C_{out})(V_{out})/I_{LIM}]\,(I_{LIM}/C_{out})$$

$$\Delta V = (SR+/SR-)\,(V_{out})$$

This equation is derived from assumptions which are reasonably correct for a wide range of switching regulator applications using a transconductance type error amplifier whose frequency compensation network consists of a capacitor from output to ground. It shows that to a first approximation, overshoot voltage is independent of user controlled parameters such as $I_{lim}$, $C_{out}$ and amplifier slew rate—assuming that positive and negative slew rates are equal, as they normally are. It also shows that output overshoot is a very real problem. It is equal in amplitude to the actual output voltage.

In many cases, a resistor ($R_c$) is used in series with the error amplifier compensation capacitor ($C_c$) to form a loop "zero". This is done to improve phase margin for the closed loop system. The formula for overshoot voltage with this added resistor is:

$$\Delta V = \frac{I_{LIM}}{(C_{out})(SR-)}[(SR+)(C_{out})(V_{out})/I_{LIM} - (I-)(R_c)]$$

$I-$ = negative slewing output current from error amplifier.

This equation shows that overshoot can be reduced or eliminated by making the second term in the brackets as large as the first term. In practical applications, the value of $R_c$ is restricted by loop stability considerations, so it would be desirable to increase negative slew current ($I-$) without an increase in positive slew rate or error amplifier transconductance.

This invention provides an error amplifier and method which increases negative slew rate with respect to positive slew rate to eliminate the requirement for extra external parts, or extra pins on the integrated circuit. In accordance with the invention, the basic relationship between slew rate and transconductance of a transconductance type error amplifier is modified. Specifically, the positive and negative slew rates are made unequal, with the small signal transconductance determined primarily by the lower slew rate current. The idea is to make an error amplifier whose slew rate in one direction is much higher than would normally occur with a specific small signal transconductance.

Figure 3:
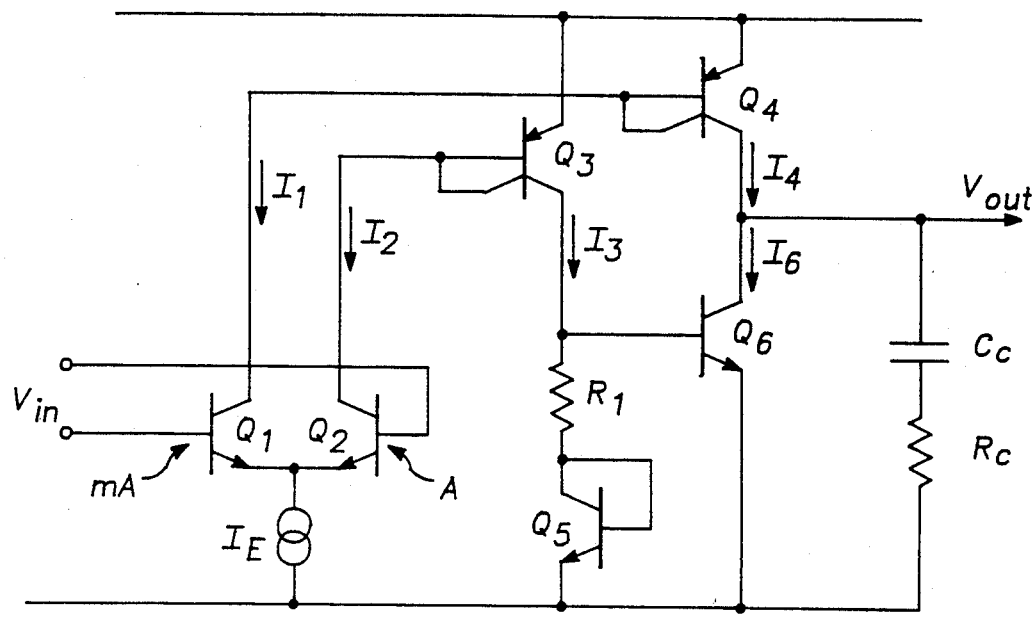
FIG. 3 shows a preferred asymmetrical transconductance error amplifier in accordance with this invention.

Referring to FIG. 3, Q1 through Q6 form a typical IC transconductance error amplifier. Q3 and Q4 are lateral PNP transistors with ½ of their collector tied to the base, giving them a current gain of 1. In a conventional design, the emitter areas of the pairs Q1/Q2, and Q5/Q6 would be equal and $R_1$ would be a short. The following relationships exist for a conventional design:
Small signal transconductance = Gm
$Gm = I_E/(2KT/q)$
Ihd E=Q1/Q2 emitter current source
K=Boltsmans cons
T=absolute temperature in Kelvin
q=electron charge
output slew rate = $SR = I_E/C_c$
The gain-bandwidth product of the amplifier (GBW) is $$GBW = Gm/2\pi C_c = I_E/(4KT \cdot \pi \cdot C_c/q)$$

To reduce overshoot on a regulator which uses this error amplifier, it would be necessary to increase the ratio of negative slew rate to gain bandwidth without a major change in positive slew rate. This assumes that the amplifier will be in negative slew during the overshoot period.

Note that for the conventional design, the ratio of slew rate to gain bandwidth is:

$$\frac{SR}{GBW} = \frac{\frac{I_E}{C_c}}{\frac{I_E}{4KT \cdot \pi \cdot C_c/q}} = 4 \cdot KT/q \cdot \pi$$

This equation shows that slew rate to gain-bandwidth ratio is a fixed constant for a conventional transconductance amplifier.

To achieve an increased ratio of slew rate to gain-bandwidth in one direction only, $R_1$ is added to the basic circuit. The Gm formula is:

$$Gm = \frac{I_e}{2(KT/q)} [2m(m+1) + m \ln m)/(m+1)^2]$$

"m" is the solution of the transcendental relationship $(m+1)(\ln m) = I_E \cdot R_1/KT/q$
The new formula for negative slew rate is:

$$SR(-) = \frac{I_E e^{\frac{I_E \cdot R_1}{KT/q}}}{C_c}$$

The new ratio of slew rate to gain-bandwidth is*

$$SR(-)/GBW = \frac{4 \cdot KT/q \cdot \pi (e^{\frac{I_E \cdot R_1}{KT/q}})}{\frac{2m(m+1 + m \ln m)}{(m+1)^2}}$$

Note that now the ratio can be manipulated by $I_E \cdot R_1$. If we let $I_E \cdot R_1$ equal 54mV, m is 2. Inserting these values into the formula yields:

$$SR(-)/GBW = 4KT/q \, \pi(4.1)$$

This is a 4:1 improvement in slew rate for the same gain-bandwidth. To achieve a significant reduction in overshoot, however, the ratio of negative to positive slew rate must be high. Positive slew rate is unaffected by $R_1$, so the ratio of negative to positive slew is:

$$SR(-)/SR(+) = e^{\frac{I_E \cdot R_1}{KT/q}}$$

For $I_E \cdot R_1 = 54mV$, the ratio of slew rates is 8:1.

When $R_1$ is added, the input transistors Q1, Q2 operate at a quiescent current ratio equal to m instead of the conventional 1:1 ratio. This creates an offset voltage for the error amplifier. The offset voltage can be canceled by making the emitter area ratio of Q1 to Q2 equal to m. If $I_E$ is made to be proportional to absolute temperature (commonly known as PTAT), the offset voltage of the error amplifier will remain at zero over temperature.

Figures 4, 5:
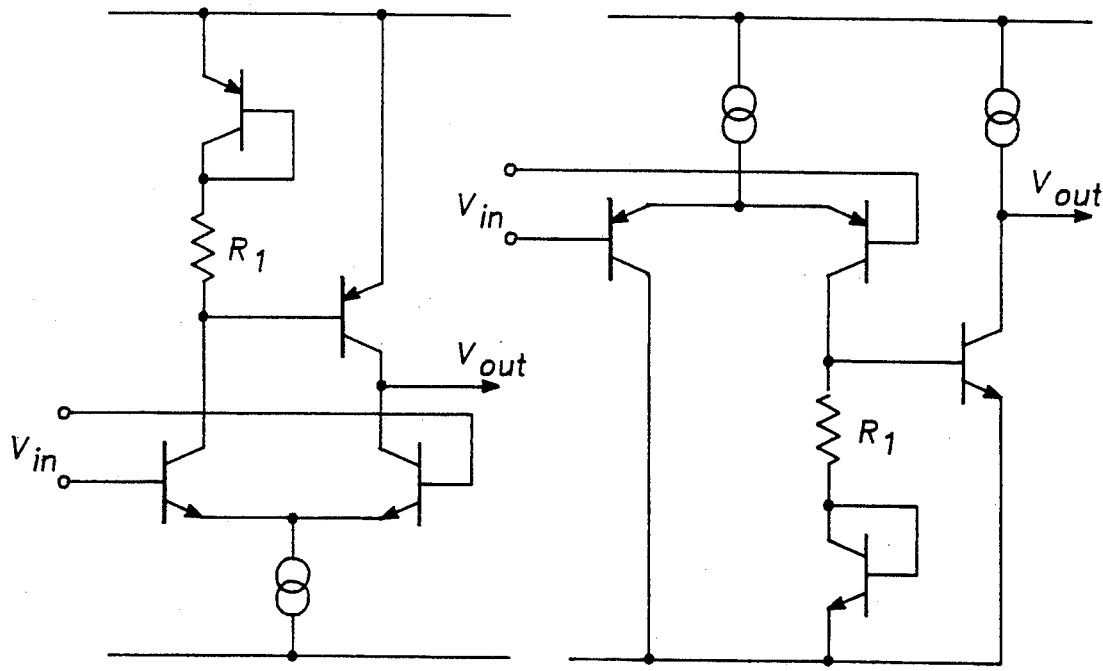
FIG. 4 shows another embodiment of a asymmetrical transconductance error amplifier.
FIG. 5 shows still another embodiment of a asymmetrical transconductance error amplifier.

FIG. 4 shows an alternative embodiment of an asymmetrical transconductance error amplifier. The error amplifier is shown in FIG. 4 has a higher positive slew rate than the negative slew rate.

FIG. 5 shows another embodiment of an asymmetrical transconductance error amplifier in which the negative slew rate is higher than the positive slew rate.

Thus, there has been provided an improved switching regulator in which a transconductance feedback error amplifier in a slew rate limited condition provides asymmetrical slew rates whereby to minimize output voltage overshoot.

What is claimed is:

1. A switching regulator network for receiving input voltage and providing a regulator output voltage including:
   - a pulse width modulated switching circuit which regulates the output voltage responsive to a feedback error signal,
   - a transconductance error amplifier for sampling the output voltage and comparing it to a reference voltage and providing said feedback error signal whereby to regulate the output voltage, said transconductance amplifier including means for providing a higher negative rate of change of feedback error signal than positive rate of change of feedback error signal.

2. A switching regulator as in claim 1 including an impedance network across which said feedback error signal is developed and in which said transconductance amplifier supplies a different maximum current to charge said impedance network than to discharge said network to provide different slew rates.

3. A switching regulator as in claim 2 in which said transconductance amplifier includes a pair of input transistors having emitter, base, and collector connected with their emitters in common to constant current source, with their bases connected to compare the output voltage to said reference voltage, and with their collectors coupled to regulate the output voltage, said transistors having their emitter areas selected so that the current density through the transistors from said current source is equal under quiescent operation with the output voltage in regulation.

* * * * *